(12) United States Patent
Terashima et al.

(10) Patent No.: US 7,696,690 B2
(45) Date of Patent: Apr. 13, 2010

(54) SHORT-WAVELENGTH LIGHT-EMITTING ELEMENT ARRANGED IN A CONTAINER WITH A WINDOW HAVING A WINDOW BOARD FORMED OF A CALCIUM FLUORIDE CRYSTALS

(75) Inventors: Kazutaka Terashima, Ebina (JP); Suzuka Nishimura, Yamaguchi (JP)

(73) Assignee: Japan Science and Technolgoy Agency, Kawaguchi (JP)

( * ) Notice: Subject to any disclaimer, the term of this patent is extended or adjusted under 35 U.S.C. 154(b) by 999 days.

(21) Appl. No.: 11/166,523

(22) Filed: Jun. 24, 2005

(65) Prior Publication Data
US 2006/0038194 A1 Feb. 23, 2006

Related U.S. Application Data

(63) Continuation-in-part of application No. PCT/JP03/016617, filed on Dec. 24, 2003.

(30) Foreign Application Priority Data
Dec. 25, 2002 (JP) .......................... P2002-375426

(51) Int. Cl.
*H01J 63/04* (2006.01)
(52) U.S. Cl. .................. 313/512; 257/98; 257/100; 313/503
(58) Field of Classification Search .......... 313/512; 257/98, 100
See application file for complete search history.

(56) References Cited

U.S. PATENT DOCUMENTS

| | | | |
|---|---|---|---|
| 4,321,559 A * | 3/1982 | Esterowitz et al. ........... 372/41 |
| 4,782,494 A | 11/1988 | Pollack et al. | |
| 5,230,831 A * | 7/1993 | Srivastava ........... 252/301.4 F |
| 6,066,861 A | 5/2000 | Hohn et al. | |
| 6,146,456 A | 11/2000 | Mizugaki et al. | |
| 6,245,259 B1 | 6/2001 | Hohn et al. | |
| 6,277,301 B1 | 8/2001 | Hohn et al. | |
| 7,019,335 B2 * | 3/2006 | Suenaga ................... 257/99 |

(Continued)

FOREIGN PATENT DOCUMENTS

| | | |
|---|---|---|
| CN | 1228873 A | 9/1999 |
| DE | 3781098 | 1/1988 |
| DE | 19625622 | 1/1998 |
| DE | 19638667 | 4/1998 |
| EP | 0268670 | 2/1995 |

(Continued)

OTHER PUBLICATIONS

Abstract: P1 9709998-8, Jun. 26, 1997, Ulrike Reeh, et al.
Abstract: P1 9706787-3, Sep. 22, 1997, Alexandra Debra, et al.

*Primary Examiner*—Peter Macchiarolo
(74) *Attorney, Agent, or Firm*—Masuvalley & Partners

(57) ABSTRACT

A short-wavelength light-emitting element such as an ultraviolet light-emitting element or blue light-emitting element is arranged in a container which has a window with a window board formed of calcium fluoride crystals. Fluoride crystals are ones which contain either metal or metal halide, or both of them. In a production method of fluoride crystals in which the cavity of a crucible is filled with raw material powder and this crucible is heated in a vertical Bridgman furnace, a production method of fluoride crystals of the present invention is the one in which the shortest diameter of a cross section of the cavity of the crucible is small. In a crucible, whose cavity is filled with raw material powder, heated in a vertical Bridgman furnace to produce fluoride crystals, a crucible is the one in which the shortest diameter of a section of the cavity is small.

18 Claims, 7 Drawing Sheets

U.S. PATENT DOCUMENTS

| | | |
|---|---|---|
| 2001/0000622 A1 | 5/2001 | Reeh et al. |
| 2001/0002049 A1 | 5/2001 | Reeh et al. |
| 2001/0028053 A1 | 10/2001 | Hohn et al. |
| 2001/0030326 A1 | 10/2001 | Reeh et al. |
| 2001/0045647 A1 | 11/2001 | Hohn et al. |
| 2003/0213916 A1* | 11/2003 | Orvek ................. 250/372 |
| 2004/0120155 A1* | 6/2004 | Suenaga ............... 362/362 |

FOREIGN PATENT DOCUMENTS

| | | |
|---|---|---|
| EP | 0972863 | 1/2000 |
| EP | 1 221724 | 7/2002 |
| EP | 0 862794 | 11/2002 |
| JP | 61-1068 | 1/1986 |
| JP | 63-503501 | 12/1988 |
| JP | 5-188203 | 7/1993 |
| JP | 11-500584 | 1/1999 |
| JP | P2000-34193 A | 2/2000 |
| JP | P2000-236112 A | 8/2000 |
| JP | P2000-512806 A | 9/2000 |
| JP | P2001-352101 A | 12/2001 |
| JP | 2002145642 A * | 5/2002 |
| JP | P2002-208733 A | 7/2002 |
| JP | P2002-232002 A | 8/2002 |
| JP | P2002-249769 A | 9/2002 |
| JP | P2002-317177 A | 10/2002 |
| JP | P2002-317178 A | 10/2002 |
| WO | WO 87/07448 | 12/1987 |
| WO | WO 97/50132 | 12/1997 |
| WO | WO 98/12757 | 3/1998 |

* cited by examiner

SHORT-WAVELENGTH LIGHT-EMITTING ELEMENT ARRANGED IN A CONTAINER WITH A WINDOW HAVING A WINDOW BOARD FORMED OF A CALCIUM FLUORIDE CRYSTALS

REFERENCE TO RELATED APPLICATIONS AND INCORPORATION BY REFERENCE

This application is a continuation-in-part of International Patent Application PCT/JP2003/016617 filed Dec. 24, 2003 and published as WO 2004/059750 on Jul. 15, 2004, which claims priority from Japanese Patent Application Number 2002-375426 filed Dec. 25, 2002.

This application, and each application and patent mentioned in this document, and each document cited or referenced in each of the above applications and patents, including during the prosecution of each of the applications and patents ("application cited documents") and any manufacturer's instructions or catalogues for any products cited or mentioned in each of the applications and patents and in any of the application cited documents, are hereby incorporated herein by reference. Furthermore, all documents cited in this text, and all documents cited or referenced in documents cited in this text, and any manufacturer's instructions or catalogues for any products cited or mentioned in this text, are hereby incorporated herein by reference.

It is noted that in this disclosure, terms such as "comprises", "comprised", "comprising", "contains", "containing" and the like can have the meaning attributed to them in U.S. Patent law; e.g., they can mean "includes", "included", "including" and the like. Terms such as "consisting essentially of" and "consists essentially of" have the meaning attributed to them in U.S. Patent law, e.g., they allow for the inclusion of additional ingredients or steps that do not detract from the novel or basic characteristics of the invention, i.e., they exclude additional unrecited ingredients or steps that detract from novel or basic characteristics of the invention, and they exclude ingredients or steps of the prior art, such as documents in the art that are cited herein or are incorporated by reference herein, especially as it is a goal of this document to define embodiments that are patentable, e.g., novel, non-obvious, inventive, over the prior art, e.g., over documents cited herein or incorporated by reference herein. And, the terms "consists of" and "consisting of" have the meaning ascribed to them in U.S. Patent law; namely, that these terms are closed ended.

TECHNICAL FIELD

The present invention relates to: a light-emitting element device using a short-wavelength light-emitting element such as an ultraviolet light-emitting element or blue light-emitting element; a light-receiving element device using a short-wavelength light-receiving element; and an optical device.

The present invention relates to: fluoride crystals; a production method of these fluoride crystals; and a crucible for producing these fluoride crystals.

BACKGROUND ART

In the past, in a light-emitting element device using a short-wavelength light-emitting element such as an ultraviolet light-emitting element or blue light-emitting element, this short-wavelength light-emitting element 1 such as an ultraviolet light-emitting element or blue light-emitting element has been covered, for example, with epoxy resin 2 as shown in FIG. 5.

Also, in a light-emitting element device which uses this short-wavelength light-emitting element 1 such as an ultraviolet light-emitting element or blue light-emitting element and is intended to obtain visible light through wavelength conversion, an element such as phosphorus has been mixed into this covering epoxy resin 2 so as to obtain yellow light.

Further, calcium fluoride crystals (fluorite) are generally known to be highly resistant to ultraviolet rays such as KrF and ArF excimer lasers (Published Japanese Patent Application No. 2001-33379).

However, this short-wavelength light-emitting element 1 such as an ultraviolet light-emitting element or blue light-emitting element is high in the energy of light, which thus decomposes couplings of the epoxy resin 2 or the like covering this short-wavelength light-emitting element 1 and causes devitrification. As a result, regarding a light-emitting element device using this short-wavelength light-emitting element 1, there has been such inconvenience in which light-emitting efficiency lowers noticeably or similar effects are caused, as it is used.

Further, when in order to perform wavelength conversion in a light-emitting element device using this short-wavelength light-emitting element 1 an element such as phosphorus, for example, is mixed into the covering epoxy resin 2 to obtain a light-emitting element device emitting yellow light, with the energy of this short-wavelength light, the decomposition of the epoxy resin 2 progresses as it is used, light-emitting efficiency deteriorates, and this phosphorus atom becomes directly attached to the surface of wiring of a diode constituting this short-wavelength light-emitting element 1, corroding this wiring and causing an inconvenience in which reliability is lowered greatly.

Meanwhile, the development of calcium fluoride which is great in hardness, excellent in acid resistance, small in dislocation density, and small in strain amount is being hoped for.

DISCLOSURE OF INVENTION

The first object of the present invention is to rectify the lowering of reliability such as the lowering of light-emitting efficiency and the corroding of wiring; the second object is to provide novel fluoride crystals; the third object is to provide a novel production method of fluoride crystals; and the fourth object is to provide a novel crucible.

A light-emitting element device of the present invention is one in which a short-wavelength light-emitting element such as a blue light-emitting element is arranged inside a container which has a window with a window board formed of calcium fluoride crystals.

According to the above-described present invention, since a short-wavelength light-emitting element such as a blue light-emitting element is arranged inside a container which has a window with a window board formed of calcium fluoride crystals, this window board formed of calcium fluoride crystals is stable as far as 1400° C., is highly resistant to the energy of short-wavelength light, and has a good light transmissivity to short-wavelength light; therefore, it is possible to obtain a reliable, favorable light-emitting element device of short-wavelength light emission.

Further, in the above device of the present invention, a fluorescent substance is applied to the window board formed of calcium fluoride crystals, and blue light is converted to other visible light by means of this window board.

According to the above device of the present invention, since no calcium fluoride crystal of the window board decomposes, reliability is improved without corroding wiring of a diode constituting the short-wavelength light-emitting element.

Further, a light-emitting element device of the present invention is one in which a short-wavelength light-emitting element is covered with epoxy resin mixed with particles of calcium fluoride crystals.

According to the above device of the present invention, since particles of calcium fluoride crystals stable as far as 1400° C. and highly resistant to the energy of short-wavelength light are mixed into epoxy resin, resistance to decomposition is improved.

Further, the present invention is one in which one or several kinds among lanthanum based metals of lanthanum, europium, erbium, neodymium, cerium, gadolinium and samarium are added to the calcium fluoride crystals.

According to the above invention, since one or several kinds among lanthanum based metals such as lanthanum, europium, erbium, neodymium, cerium, gadolinium, samarium and the like are added to calcium fluoride crystals, it is possible to obtain a reliable light-emitting element device which emits light of various colors.

Further, according to the present invention, yttrium is added to calcium fluoride crystals.

According to the above invention, since yttrium is added to calcium fluoride crystals, it is possible to obtain a reliable light-emitting element device which emits light of various colors.

Further, a light-receiving element device of the present invention is one in which a short-wavelength light-receiving element is provided inside a container which has a window board formed of calcium fluoride crystals.

According to the above present invention, since a short-wavelength light-receiving element which receives short-wavelength light of an ultraviolet light-emitting element, blue light-emitting element or the like is arranged inside a container which has a window with a window board formed of calcium fluoride crystals, this window board formed of calcium fluoride crystals is stable up to 1400° C., is highly resistant to the energy of short-wavelength light, and has a favorable light transmissivity to short-wavelength light; therefore, it is possible to obtain a light-receiving element device in which short-wavelength light emitted from the short-wavelength light-emitting element can be favorably detected by a short-wavelength light-receiving element.

Further, an optical device of the present invention is one in which a short-wavelength light-emitting element and a light-receiving element are provided inside a container which has a window board formed of calcium fluoride crystals.

According to the above invention, since a short-wavelength light-emitting element such as an ultraviolet light-emitting element or blue light-emitting element and a light-receiving element are arranged inside a container which has a window with a window board formed of calcium fluoride crystals, this window board formed of calcium fluoride crystals is stable up to 1400° C., is highly resistant to the energy of short-wavelength light, and has an excellent light transmissivity to short-wavelength light; therefore, it is possible to obtain an optical device in which returning light of short-wavelength light emitted from this short-wavelength light-emitting element can be favorably detected by the light-receiving element.

Fluoride crystals of the present invention are ones which contain either metal or metal halide, or both of them.

Regarding the above-described fluoride crystals, the metal may be made of a 4A group element, and the metal halide may be made of either a 2A group element halide or a 4A group element halide, or of both of them.

Regarding the above-described fluoride crystals, the metal may be made of a 4A group element, the metal halide may be made of either a 2A group element fluoride or a 4A group element fluoride, or of both of them, and the fluoride crystals are made of either calcium fluoride or barium fluoride, or of both of them.

Regarding the above-mentioned fluoride crystals, the metal may be made of titanium, the metal halide may be made of one or more kinds selected from titanium fluoride, magnesium fluoride and strontium fluoride, and the fluoride crystals may be made of calcium fluoride.

A production method of fluoride crystals of the present invention is a method in which a cavity in a crucible is filled with raw material powder and this crucible is heated in a vertical Bridgman furnace, wherein the shortest diameter of a cross-section of the cavity of the crucible is small.

In the above-mentioned production method of fluoride crystals, the shortest diameter can be made 2.5 cm or less.

In the above-mentioned production method of fluoride crystals, the fluoride crystals may contain calcium fluoride.

A crucible of the present invention is a crucible whose cavity is filled with raw material powder and which is heated in a vertical Bridgman furnace, to produce fluoride crystals, wherein the shortest diameter of a cross-section of the cavity is small.

In the above-mentioned crucible, the shortest diameter can be 2.5 cm or less.

In the above-mentioned crucible, the fluoride crystals may contain calcium fluoride.

BEST MODE OF CARRYING OUT THE INVENTION

Hereinafter, a light-emitting element device, light-receiving element device and optical device according to embodiments of the present invention will be explained with reference to the drawings.

Figure 1:
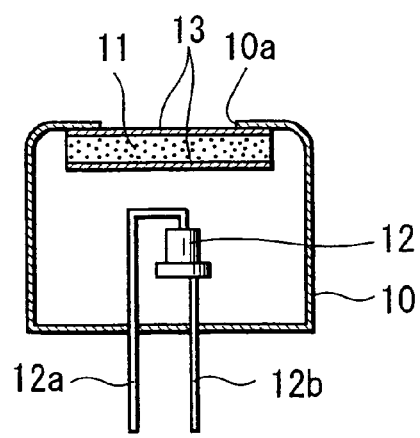
FIG. 1 is a sectional view showing an embodiment of a light-emitting element device of the present invention.

FIG. 1 shows a light-emitting element device according to the embodiment: in FIG. 1, a numeral 10 denotes a metal container, made of for example metal such as aluminum, which has a window 10a on the top surface thereof, and a window board 11, formed of calcium fluoride ($CaF_2$) crystals, both surfaces of which have been mirror-polished is installed on the window 10a of this metal container 10. In this case, when the window board 11 is attached and adhered to the metal container 10, organic adhesive is used.

In this embodiment, inside the metal container 10 is provided a short-wavelength light-emitting element 12 such as an ultraviolet light-emitting diode of an AlN-based laser diode, a blue light-emitting diode of a GaN-based compound semiconductor, or a semiconductor light-emitting excitation ultraviolet solid-state laser, such that the light-emitting direction is of the window 10a. Numerals 12a and 12b are lead terminals of this short-wavelength light-emitting element 12.

In this embodiment, both surfaces of this window board 11 formed of calcium fluoride crystals are coated with a thin film 13 of oxide silicon ($SiO_2$) or titanium oxide ($TiO_2$) as a protective film for preventing reflection and moisture absorption. By doing so, it is possible to prevent the deliquescence of the calcium fluoride crystals constituting this window board 11. In this case, either the front surface or back surface of this window board 11 may be coated with this thin film 13 of oxide silicon ($SiO_2$) or titanium oxide ($TiO_2$).

Also, in this embodiment, the inside of this metal container 10 is filled with an inactive gas such as argon to obtain chemical stability.

The calcium fluoride crystalline substance forming this window board 11 may be a single crystal substance or a polycrystalline substance. As regards the production method of these calcium fluoride crystals: basically, a column of several mm in diameter is formed by means of the vertical Bridgman method, which is a crystal growth method; as this window board 11, this calcium fluoride crystalline substance undergoes cylindrical grinding, slicing and polishing, and then both surfaces thereof are spattered with the $SiO_2$ or $TiO_2$ 13 as a finish by approximately 100 nm in thickness, with the whole thickness ultimately becoming approximately 1 mm.

Figure 2:
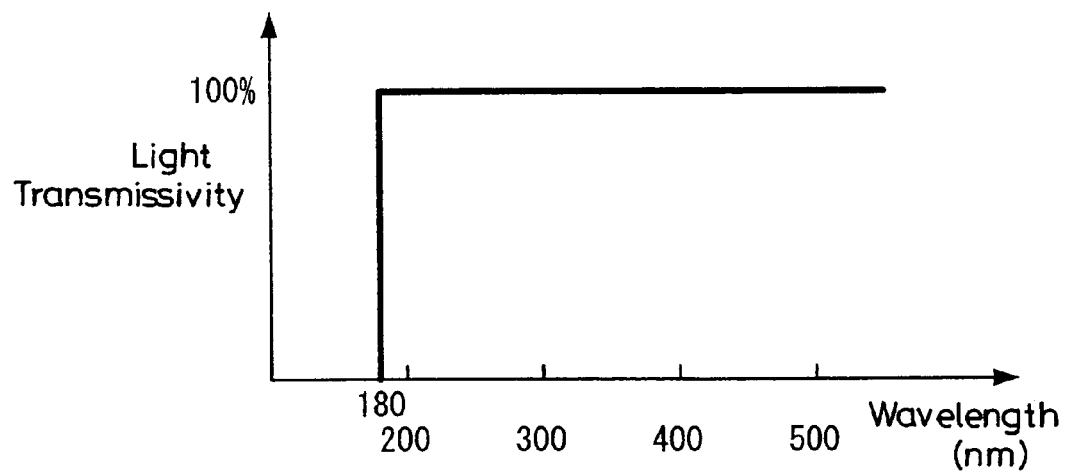
FIG. 2 is a diagram provided to explain the present invention.

This window board 11 of calcium fluoride crystals has an excellent light transmissivity to short-wavelength light, that is, transmits 100% of a short wavelength of 180 nm or more as shown in FIG. 2, and this window board 11 of calcium fluoride crystals is stable in high temperatures up to 1400° C.

According to a light-emitting element device of the above embodiment, since the short-wavelength light-emitting element 12 such as an ultraviolet light-emitting element or blue light-emitting element is arranged inside the metal container 10 which has the window 10a with the window board 11 formed of calcium fluoride crystals, this window board 11 formed of calcium fluoride crystals is stable up to 1400° C., is highly resistant to the energy of short-wavelength light, and has an excellent light transmissivity to short-wavelength light; therefore, it is possible to obtain a reliable, favorable light-emitting element device of short-wavelength light emission.

Also, in the light-emitting element device shown in the example of FIG. 1, a fluorescent substance may be applied to the front surface or back surface of the window board 11 formed of calcium fluoride crystals.

In this case, when an ultraviolet light-emitting element is used as the short-wavelength light-emitting element 12, it is possible to convert ultraviolet light to visible light such as white light, and to gain the same functional effectiveness as described above.

Further, in this case, when a blue light-emitting element is used as the short-wavelength light-emitting element 12, it is possible to convert the blue light to other visible light, and to gain the same functional effectiveness as described above.

In addition, in the light-emitting element device in the example of FIG. 1, one or several kinds among lanthanum based metals such as lanthanum, neodymium, cerium, gadolinium, samarium, europium, erbium, polonium and the like may be added to the window board 11 formed of calcium fluoride crystals.

In this case, short-wavelength light from the short-wavelength light-emitting element 12 such as an ultraviolet light-emitting element or blue light-emitting element is converted to light of various colors by this window board 11, and so a light-emitting element device which emits light of various colors can be obtained, and the same functional effectiveness as described above can be obtained.

Next, specific examples in which to obtain the window board 11 in this case are described.

After 3 g of neodymium oxide ($Nd_2O_3$) had been added to 200 g of calcium fluoride ($CaF_2$) raw material and the raw material had been melted in a carbon crucible using a vacuum Bridgman furnace of $10^{-6}$ Torr in an ultimate vacuum, the molten state was maintained for about an hour, and crystals were grown at a temperature gradient of 9° C./cm and at a growth rate of 3 cm per hour.

In order to discharge oxygen gas, released from oxide, from the melt, the inside of this crucible was filled with granular $ZnF_2$ crystals or granular Teflon® (CFn) simultaneously. The inner diameter of this crucible is 1 cm.

On taking the crystals out of an ampoule after the growth, it was found that single crystal had grown. These grown crystals were heat-treated for about 20 hours under the condition of 1000° C. at the temperature and $10^{-6}$ Torr the vacuum. These crystals were blue in color.

These crystals underwent cylindrical grinding, slicing and polishing, and then both surfaces thereof were spattered with $SiO_2$ or $TiO_2$ as a finish by approximately 100 nm in thickness, thus forming a window board 11 whose ultimate thickness is approximately 1 mm.

Using this window board 11, such a light-emitting element device as shown in FIG. 1 was constructed and an ultraviolet light-emitting element was used as this short-wavelength light-emitting element 12, a light-emitting element device which emits blue light was obtained. In this light-emitting element device also, it goes without saying that the same functional effectiveness as described above can be obtained.

Similarly, a window board 11 in which cerium had been added to calcium fluoride crystals was formed to be used, an ultraviolet light-emitting element was used as the short-wavelength light-emitting element 12, and a light-emitting element device as shown in FIG. 1 was thus obtained, in which with light of 200 nm to 340 nm emitted from the short-wavelength light-emitting element 12, wavelength ranges of 350 nm to 590 nm and 670 nm to 770 nm of light emitted from this light-emitting element device are obtained, and blue color emission and yellow color emission are overlapped to emit white light. This indicates that a white LED can be obtained using an ultraviolet light-emitting element. Further, the window board 11 in which cerium has been added to calcium fluoride crystals has such a characteristic as strongly absorbs light shorter than 360 nm in wavelength. In this light-emitting element device, it goes without saying that the same functional effectiveness as described above can also be obtained.

Similarly, a window board 11 in which lanthanum had been added to calcium fluoride crystals was formed to be used, an ultraviolet light-emitting element was used as the short-wavelength light-emitting element 12, and such a light-emitting element device as shown in FIG. 1 was thus obtained, in which with light of 320 nm emitted from the short-wavelength light-emitting element 12, considerably strong light emission was obtained in the vicinity of 370 nm of wavelength of light emitted from this light-emitting element device, the light-emitting wavelength range thereof was wide, and with light-emitting wavelength of 370 nm of the short-wavelength light-emitting element 12, light emission up to 500 nm was confirmed. On the whole, bluish light emission was observed; however, when even stronger light was emitted from the ultraviolet light-emitting element, white light emission was obtained by means of the overlap with yellow color emission. In this light-emitting element device, it goes without saying that the same functional effectiveness as described above can also be obtained.

Similarly, when a window board 11 in which samarium had been added to calcium fluoride crystals was formed to be used, an ultraviolet light-emitting element was used as the short-wavelength light-emitting element 12, and such a light-emitting element device as shown in FIG. 1 was thus obtained, in which two emission centers were obtained and orange light emission was most strongly observed.

Further, in the light-emitting element device in the example of FIG. 1, one or several kinds of impurities forming impurity levels, such as yttrium, may be added to the window board 11 formed of calcium fluoride crystals.

In this case, short-wavelength light from the short-wavelength light-emitting element 12 such as an ultraviolet light-emitting element or blue light-emitting element is converted to light of various colors by this window board 11, and so a light-emitting element device which emits light of various colors can be obtained. In the above light-emitting element device, it goes without saying that the same functional effectiveness as described above can also be obtained.

Figure 3:
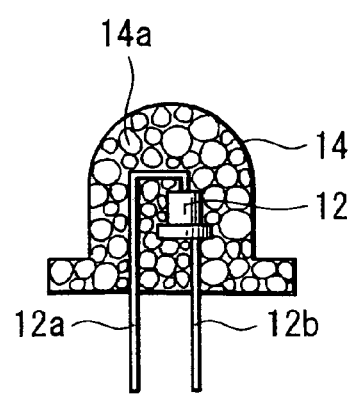
FIG. 3 is a sectional view showing another embodiment of the present invention.
Figure 4:
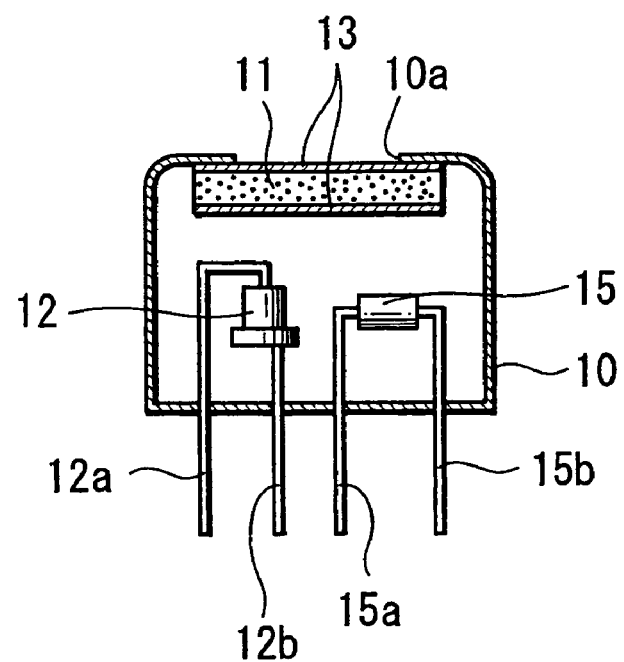
FIG. 4 is a sectional view showing an embodiment of an optical device of the present invention.
Figure 5:
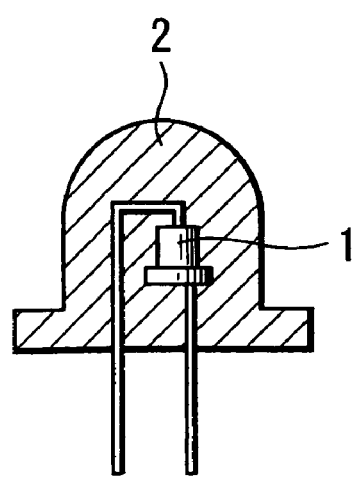
FIG. 5 is a sectional view showing an example of a conventional light-emitting element device.

Further, FIGS. 3 and 4 each show another embodiment of the present invention.

In explaining these FIGS. 3 and 4, parts which correspond to the ones in FIG. 1 are given the same numerals to omit detailed explanations thereof.

In the light-emitting element device shown in the example of FIG. 3, a short-wavelength light-emitting element 12 such as an ultraviolet light-emitting diode of an AlN-based laser diode or the like, a blue light-emitting diode of a GaN-based compound semiconductor, or a semiconductor light-emitting excitation ultraviolet solid-state laser or the like is covered with epoxy resin 14 mixed with calcium fluoride crystal particles 14a.

According to the above embodiment, since the calcium fluoride crystal particles 14a which have an excellent light transmissivity, are stable up to 1400° C. and highly resistant to the energy of short-wavelength light are mixed into the epoxy resin 14, resistance to decomposition is improved.

Further, in this light-emitting element device shown in FIG. 3, one or several kinds among lanthanum based metals such as lanthanum, neodymium, cerium, gadolinium, samarium, erbium, europium, polonium and the like may be added to the calcium fluoride crystal particles 14a, or impurities such as yttrium which form impurity levels may be added.

In this case, short-wavelength light from the short-wavelength light-emitting element 12 such as an ultraviolet light-emitting element or blue light-emitting element is converted to light of various colors by these calcium fluoride crystal particles 14a, and so a light-emitting element device which emits light of various colors can be obtained.

Also, in the above-mentioned examples of FIGS. 1 and 3, a light-receiving element device may be obtained by providing a short-wavelength light-receiving element instead of the short-wavelength light-emitting element 12. In this case, since a short-wavelength light-receiving element which receives short-wavelength light of an ultraviolet light-emitting element, blue light-emitting element or the like is arranged inside a container which has a window with a window board formed of calcium fluoride crystals, this window board formed of calcium fluoride crystals is stable up to 1400° C. and is highly resistant to the energy of short-wavelength light, and also has an excellent light transmissivity to short-wavelength light; therefore, it is possible to obtain a light-receiving element device in which short-wavelength light emitted from this short-wavelength light-emitting element can be favorably detected by a short-wavelength light-receiving element.

Further, in the example of FIG. 4, a window board 11, formed of calcium fluoride crystals, both surfaces of which have undergone mirror polishing is attached to a window 10a provided on the top surface of a metal container 10 made of a metal such as aluminum, for example.

Both surfaces of this window board 11 formed of calcium fluoride crystals are coated with a thin film 13 of oxide silicon ($SiO_2$) or titanium oxide ($TiO_2$) as a protective film for preventing reflection and moisture absorption. In this case, either the front surface or back surface of this window board 11 may be coated with this thin film 13 of oxide silicon or titanium oxide.

In this embodiment, in this metal container 10 is provided a short-wavelength light-emitting element 12 such as an ultraviolet light-emitting diode of an AlN-based laser diode or the like, a blue light-emitting diode of a GaN-based compound semiconductor, or a semiconductor light-emitting excitation ultraviolet solid-state laser such that the light-emitting direction is in the direction of the window 10a; also, in this metal container 10 is provided a light-receiving element 15 made of a semiconductor such that the light-receiving direction thereof is in the direction of the window 10a side. Numerals 15a and 15b each denotes lead terminals of this light-receiving element 15.

Further, in this embodiment, the inside of this metal container 10 is filled with an inactive gas such as argon to obtain chemical stability.

In this embodiment, since the short-wavelength light-emitting element 12 such as an ultraviolet light-emitting element or blue light-emitting element and the light-receiving element 15 are provided inside the metal container 10 which has the window 10a with the window board 11 formed of calcium fluoride crystals, this window board 11 formed of calcium fluoride crystals is stable up to 1400° C., is highly resistant to the energy of short-wavelength light, and has an excellent light transmissivity to short-wavelength light; therefore, it is possible to obtain an optical device in which returning light of short-wavelength light emitted from this short-wavelength light-emitting element 12 can be favorably detected by this light-receiving element 15. In this example of FIG. 4, it goes without saying that the same functional effectiveness as in the example of FIG. 1 can also be obtained.

Note that although examples in which the metal container 10 is used have been described in the above-mentioned examples, a ceramic container may be used instead of this.

According to the present invention, it is possible to obtain a light-emitting element device of short-wavelength light emission, a light-receiving element device and an optical device, all of which are reliable and excellent.

Also, according to the present invention, it is possible to obtain a light-emitting element device which emits visible light of various kinds (light of various colors), using short-wavelength light from a short-wavelength light-emitting element such as an ultraviolet light-emitting element or blue light-emitting element.

It should be noted that the present invention is not limited to the above-mentioned examples but various other structures can be employed without departing from the gist of the present invention.

Next, fluoride crystals are explained.

Fluoride crystals are produced, using a vertical Bridgman furnace. A crucible made of carbon is filled with raw material powder and then inserted in a vertical Bridgman furnace. After that, the pressure inside the electric furnace is reduced to a predetermined pressure, and with this pressure being kept, the temperature of the electric furnace is raised to a predetermined temperature. In this state, temperature is kept for a predetermined time and the raw material inside is thus melted to be stable. After that, with the temperature kept, the crucible is lowered for a predetermined distance at a predetermined rate. After that, the temperature of the electric furnace is lowered to room temperature, in a predetermined time period.

A main constituent of the fluoride crystals are explained.

As a main constituent of the fluoride crystals, calcium fluoride, barium fluoride, strontium fluoride, magnesium fluoride or the like can be used. Regarding the ones enumerated above, one may be used, or two or more kinds among them may be mixed together to be used.

A constituent added to the fluoride crystals is explained. As a constituent added to the fluoride crystals, a metal or a metal halide can be used. Either a metal or a metal halide, or both of them can be added.

As the metal, a 4A group element can be used. Specifically, titanium, zirconium or the like can be used.

The metal is not limited to the 4A group elements. In addition, a 2A group element can be used. Specifically, magnesium, strontium, barium or the like can be used.

Further, a 3A group element can be used. Specifically, yttrium, a lanthanum based element (La, Ce, Pr, Nd, Sm, Eu, Gd, Tb, Dy, Ho, Er), or the like can be used.

As a metal halide, a 4A group element halide can be used. Specifically, titanium fluoride, zirconium fluoride or the like can be used. Regarding the ones enumerated above, one may be used independently, or two or more kinds among them may be mixed together to be used.

As a metal halide, a 2A group element halide can be used. Specifically, magnesium fluoride, strontium fluoride, barium fluoride or the like can be used. Regarding the ones enumerated above, one may be used independently, or two or more kinds among them may be mixed together to be used.

As the metal halide, in addition, a lanthanum based element halide can be used. Specifically, cerium fluoride, lanthanum fluoride, europium fluoride or the like can be used. Regarding the ones enumerated above, one may be used independently, or two or more kinds among them may be mixed together to be used.

A constituent added to the fluoride crystals is not limited to the above-mentioned metals and metal halides. In addition, a lanthanum based oxide, a 2A group oxide or the like can be used as an oxide.

Thus, since the present invention contains either metal or metal halide, or both of them, novel fluoride crystals can be provided.

It should be noted that the present invention is not limited to the above-mentioned examples but needless to say various other structures can be employed without departing from the gist of the present invention.

Next, practice examples concerning the present invention are explained specifically. Note that needless to say the present invention is not limited to these practice examples.

Practice Example 1

Ti-Added $CaF_2$

Titanium-added calcium fluoride was produced.

Figure 6A:
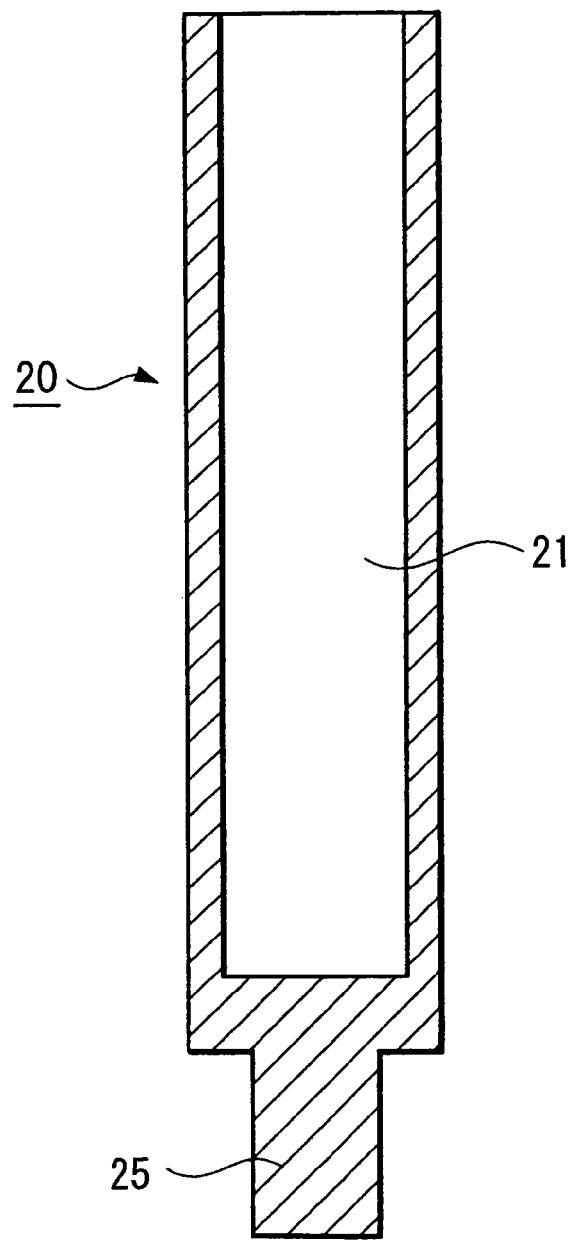
FIG. 6A is a sectional view showing a crucible used for producing fluoride crystals of the present invention.
Figure 6B:
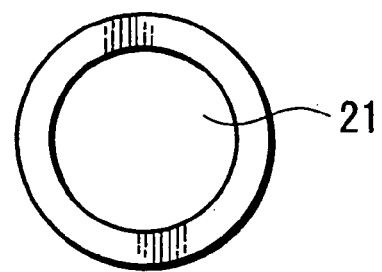
FIG. 6B is a plan view showing a crucible used for producing fluoride crystals of the present invention.
Figure 6C:
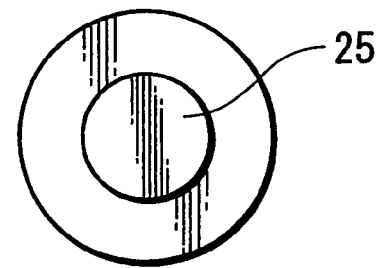
FIG. 6C is a bottom view showing a crucible used for producing fluoride crystals of the present invention.

A production method of titanium-added calcium fluoride is explained. FIGS. 6A, 6B and 6C show a carbon crucible which is used for producing fluoride crystals of the present invention. The diameter of a cavity 21 is one inch (2.54 cm). The carbon crucible was filled with powder that is the raw material for $CaF_2$, and then was inserted in a vertical Bridgman furnace. When the raw material for $CaF_2$ was put into the carbon crucible, 0.1 mol % of Ti was added to produce crystals. If a crystal orientation is decided, seed crystals are disposed on the bottom of the crucible. If a crystal orientation is not decided, it is not necessary to use seed crystals. Afterward, the inside of the electric furnace was made a vacuum of approximately $1 \times 10^{-6}$ Torr, and with the vacuum being kept, the electric furnace was raised to 1450° C. in temperature. With this state, the temperature was kept for about two hours, so that the raw material inside was melted in accordance with a temperature distribution to became stable. After that, with the temperature kept, the above-described crucible was made to fall at a rate of 15 mm/h. The descent distance on this occasion was at 20 cm in total. The temperature gradient at the growth interface was at approximately 15° C./cm. Afterwards, the temperature of the electric furnace was lowered to room temperature in about one day.

Similarly, calcium fluoride to which 0.2 mol % of titanium had been added was produced.

The Vickers hardness and acid resistance were measured regarding the calcium fluoride crystals produced. For evaluating crystals, the middle part of crystals grown among crystals which had just been taken out of a crucible after the cooling of the electric furnace was used.

Regarding the Vickers hardness, relative changes were measured, using a Vickers hardness tester. Regarding acid resistance, the calcium fluoride crystals were immersed in a hydrochloric acid solution (in which concentrated hydrochloric acid had been diluted by a factor of five) for one day, and then the depths of etch pits were measured. Each etch pit depth was shown by the moving distance of a microscope moved to focus on the bottom of the etch pit.

Practice Example 2

$TiF_3$-Added $CaF_2$

Titanium fluoride added calcium fluoride was produced.

Practice Example 2 is the same as Practice Example 1 except that 0.1 mol % of $TiF_3$ is added when the raw material for $CaF_2$ is put into a carbon crucible.

Further, by means of a similar method to Practice Example 1, calcium fluoride to which 2 mol % of titanium fluoride had been added, and calcium fluoride to which 2 mol % of titanium fluoride and 0.5 mol % of zinc fluoride had been added were produced.

Practice Example 3

$SrF_2$-Added $CaF_2$

Strontium fluoride added calcium fluoride was produced.

Practice Example 3 is the same as Practice Example 1 except that 0.1 mol % of $SrF_2$ is added when the raw material for $CaF_2$ is put into a carbon crucible.

Further, by means of a similar method to Practice Example 1, calcium fluoride to which 0.2 mol %, 0.6 mol % or 2 mol % of strontium fluoride had been added, and calcium fluoride to which 2 mol % of strontium fluoride and 0.5 mol % of zinc fluoride had been added were produced.

Practice Example 4

$MgF_2$-Added $CaF_2$

Magnesium fluoride added calcium fluoride was produced.

Practice Example 4 is the same as Practice Example 1 except that 0.1 mol % of $MgF_2$ is added when the raw material for $CaF_2$ is put into a carbon crucible.

Further, by means of a similar method to Practice Example 1, calcium fluoride to which 0.2 mol % or 0.6 mol % of magnesium fluoride had been added, and calcium fluoride to which 0.6 mol % of magnesium fluoride and 0.5 mol % of zinc fluoride had been added were produced.

Practice Example 5

$TiF_3$, $MgF_2$-Added $CaF_2$

Titanium fluoride and magnesium fluoride added calcium fluoride was produced.

Practice Example 5 is the same as Practice Example 1 except that 0.1 mol % of $TiF_3$ and 0.1 mol % of $MgF_2$ are added when the raw material for $CaF_2$ is put into a carbon crucible.

Comparative Example 1

$CaF_2$

Nothing-added calcium fluoride was produced.

Comparative Example 1 is the same as Practice Example 1 except that only the raw material for $CaF_2$ is put into a carbon crucible.

The measurement result of the Vickers hardness and acid resistance regarding the calcium fluoride crystals in Practice Examples 1 to 5 and Comparative Example 1 that were produced as described above is shown in Tables 1 and 2.

The measurement result of the Vickers hardness is shown in Table 1.

The Vickers hardness of the nothing-added calcium fluoride (Comparative Example 1) is 952.7 N/mm$^2$.

As for the titanium-added calcium fluoride (Practice Example 1), greater values than the value of Comparative Example 1 have been obtained regarding 0.1 mol % and 0.2 mol % of titanium. It has been confirmed that by adding titanium, Vickers hardness increases.

As for the titanium fluoride added calcium fluoride (Practice Example 2), greater values than the value of Comparative Example 1 have been obtained regarding 0.1 mol % of titanium fluoride, 2 mol % of titanium fluoride, and 2 mol % of titanium fluoride+0.5 mol % of zinc fluoride. It has been confirmed that by adding titanium fluoride, Vickers hardness increases.

As for the strontium fluoride added calcium fluoride (Practice Example 3), greater values than the value of Comparative Example 1 have been obtained regarding 0.6 mol % of strontium fluoride, 2 mol % of strontium fluoride, and 2 mol % of strontium fluoride+0.5 mol % of zinc fluoride. It has been confirmed that by adding strontium fluoride, Vickers hardness increases.

As for the magnesium fluoride added calcium fluoride (Practice Example 4), greater values than the value of Comparative Example 1 have been obtained regarding 0.2 mol % of magnesium fluoride, 0.6 mol % of magnesium fluoride, and 0.6 mol % of magnesium fluoride+0.5 mol % of zinc fluoride. It has been confirmed that by adding magnesium fluoride, Vickers hardness increases.

As for the titanium fluoride and magnesium fluoride added calcium fluoride (Practice Example 5), a greater value than the value of Comparative Example 1 has been obtained regarding 0.1 mol % of titanium fluoride+0.1 mol % of magnesium fluoride. It has been confirmed that by adding titanium fluoride and magnesium fluoride, Vickers hardness increases.

As regards the strength of crystals, other elements than is shown in Table 1, a lanthanum based element such as cerium, lanthanum, europium or neodymium may be added to increase mechanical strength as well.

TABLE 1

| Sample | Impurity Concentration and Vickers Hardness (N/mm$^2$) | | | | | | |
|---|---|---|---|---|---|---|---|
| | 0 mol % | 0.1 mol % | 0.2 mol % | 0.6 mol % | 0.6 mol % + $ZnF_2$ (0.5 mol %) | 2 mol % | 2 mol % + $ZnF_2$ (0.5 mol %) |
| $CaF_2$; Ti | | 1036.7 | 978.3 | | | | |
| $CaF_2$; $TiF_3$ | | 1091 | | | | 1166 | 1115 |
| $CaF_2$; $SrF_2$ | | 847 | 855.3 | 982 | | 995.3 | 1091 |
| $CaF_2$; $MgF_2$ | | 909 | 998.75 | 1040 | 1049.25 | | |
| $CaF_2$; $TiF_3$, $MgF_2$ 1) | | 980.67 | | | | | |
| $CaF_2$ | 952.7 | | | | | | |

1) TiF3 and MgF2 are in the same mol %

The measurement result of acid resistance is shown in Table 2.

The etching depth of nothing-added calcium fluoride (Comparative Example 1) is 0.1 μm.

As for 0.1 mol % of titanium, 0.1 mol % of titanium fluoride, 0.1 mol % of magnesium fluoride, or 0.1 mol % of titanium fluoride+0.1 mol % of magnesium fluoride added calcium fluoride (Practice Examples 1, 2, 4 and 5), the etching depths are between 0.02 μm and 0.05 μm, which are smaller values than the value of Comparative Example 1. It has been confirmed that by adding titanium, titanium fluoride, magnesium fluoride, or titanium fluoride+magnesium fluoride, acid resistance improves. Further, regarding titanium, titanium fluoride, magnesium fluoride, or titanium fluoride+magnesium fluoride added crystals, it has also been confirmed that etch pits observed with a microscope are small in size in comparison with Comparative Example 1.

Calcium fluoride crystals are corroded by acid solutions relatively easily, so that acid resistance is required for window materials and the like. It is necessary particularly under such situations in which calcium fluoride crystals are exposed to acid rain for many years. If calcium fluoride crystals melt, it is thought that neutralization is effected by an alkali element appearing on the surface, and so corrosion is weakened. It is made possible if an element which is lighter than calcium and has high alkalinity is included. The above-mentioned mechanism is assumed also from the fact that, in nature, an area where calcium fluoride stably exists (the Chinese continent) together with veins of magnesium, withstands many years of acid rain, wind and snow, and exists as mountain ranges.

TABLE 2

Acid Resistance (Etching Depth when Immersed in Hydrochloric Acid for one day)

| Sample | Etching Depth (μm) |
| --- | --- |
| $CaF_2$; Ti | 0.05 |
| $CaF_2$; $TiF_3$ | 0.05 |
| $CaF_2$; $SrF_2$ | 0.02 |
| $CaF_2$; $TiF_3$, $MgF_2$ | 0.03 |
| $CaF_2$ | 0.1 |

Next, a crucible used for producing fluoride crystals is explained.

The crucible is made of carbon. In the crucible, a cavity is provided. As regards the cross-section of the cavity, the shape of the product intended can be employed, such as a circle, an ellipse, a triangle, a square, a rectangle, a polygon and the like.

Here, regarding the cross section of the cavity, the shortest distance is defined as the shortest diameter. A cross section of the cavity is characterized in that the shortest diameter is small. It is desirable that the shortest diameter be 2.5 cm or less.

The reason for that is as follows; the greater the shortest diameter of a sectional area of crystals becomes, the greater optical strain which remains inside the crystals tends to become, so that to grow crystals of a size that is intended for practical use is more advantageous in practice than to cut crystals of a size practically used out of larger crystals. Regarding a window used for a small electronic device as well, 2.5 cm can be thought as a maximum length.

Also, according to the result of the experiment, if a crystal system is made small, a growth rate can be heightened.

According to the result of the experiment as well, if a diameter is made small, dislocation density and the like tend to decrease.

The shape of this cavity can be produced in a manner that suits the purpose intended, and this shape is not necessarily vertical but able to be any from a curved one to a spiral one, for example.

The crucible can be divided into some parts. By dividing in this manner, it is possible to produce calcium fluoride crystals whose shortest diameter is extremely small.

Thus, since the shortest diameter of a cross section of the cavity of the crucible of the present invention is small, a novel production method of fluoride crystals can be provided in which the cavity of a crucible is filled with raw material powder and then this crucible is heated in a vertical Bridgman furnace.

Since the shortest diameter of a section of the cavity is small in a crucible of the present invention, a novel crucible can be provided in which the cavity is filled with raw material powder and which is heated in a vertical Bridgman furnace to produce fluoride crystals.

It should be noted that the present invention is not limited to the above-mentioned examples but needless to say various other structures can be employed without departing from the gist of the present invention.

Next, practice examples concerning the present invention are explained specifically. Note that needless to say the present invention is not limited to these practice examples.

Practice Example 6

Plate-like crystals of calcium fluoride were produced.

Figure 7A:
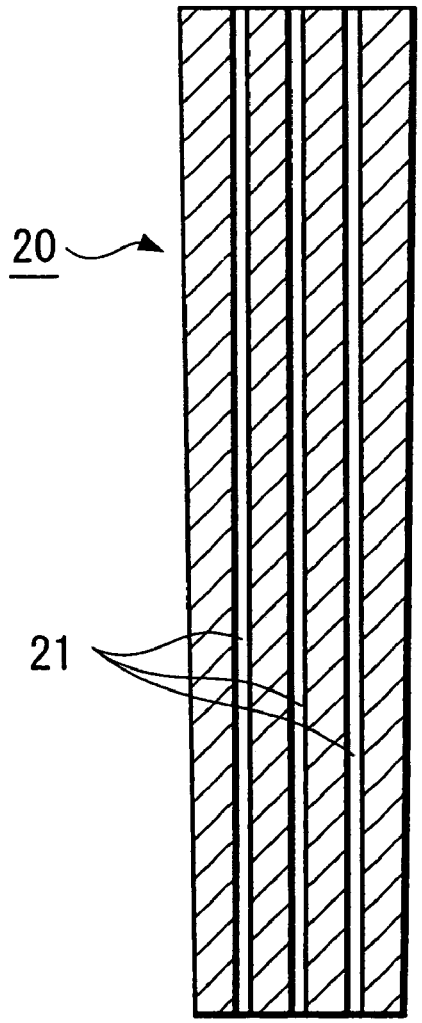
FIG. 7A is a sectional view showing an example of a crucible of the present invention.
Figure 7B:
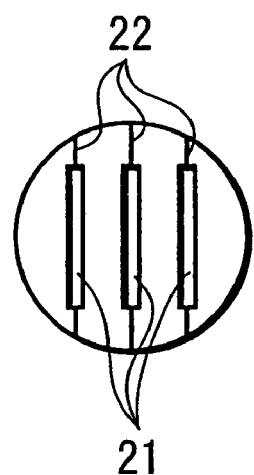
FIG. 7B is a plan view showing an example of a crucible of the present invention.
Figure 7C:
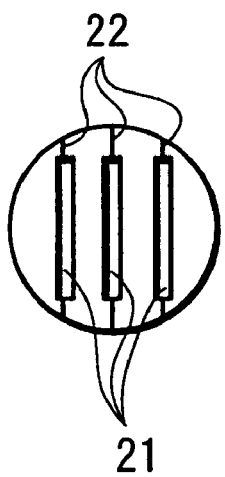
FIG. 7C is a bottom view showing an example of a crucible of the present invention.

FIGS. 7A, 7B and 7C show an example of a carbon crucible when producing the plate-like crystals. A crucible 20 consists of four parts, and they are in contact with each other on dividing surfaces 22. Cavities 21 are formed between the parts next to each other. In these cavities 21, plate-like crystals are produced. At this time the thickness of a plate is 1 mm to 3 mm, the width thereof is 1.5 cm and the length thereof is 15 cm.

Figure 8A:
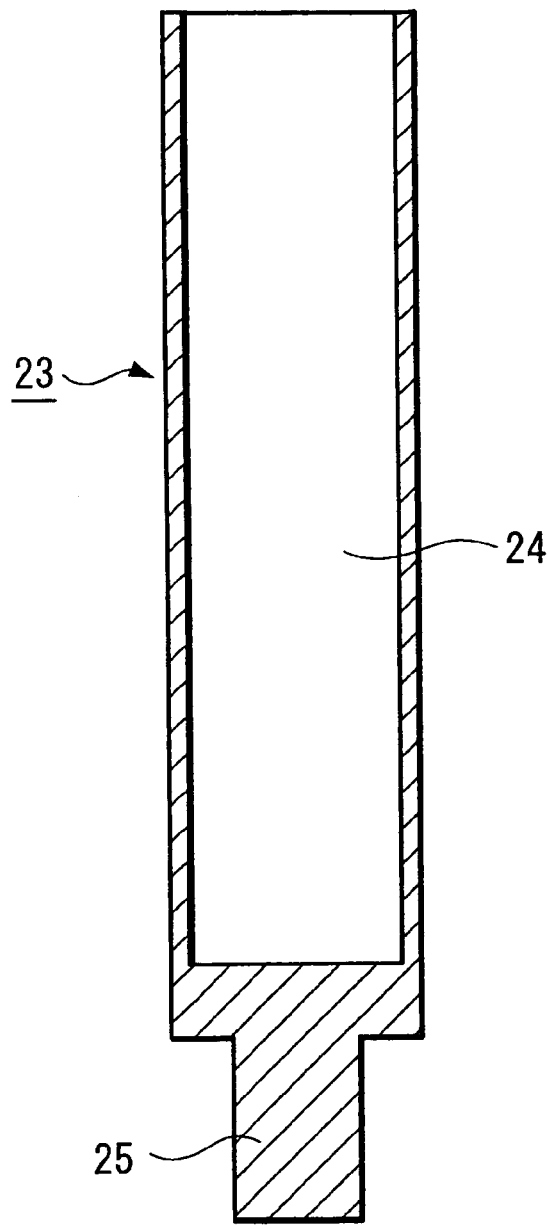
FIG. 8A is a sectional view showing an example of a holding crucible used for a crucible of the present invention.
Figure 8B:
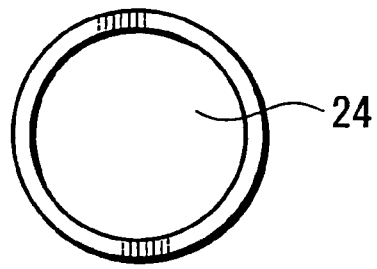
FIG. 8B is a plan view showing an example of a holding crucible used for a crucible of the present invention.
Figure 8C:
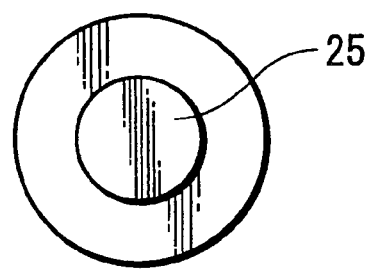
FIG. 8C is a bottom view showing an example of a holding crucible used for a crucible of the present invention.

FIGS. 8A, 8B and 8C show a holding crucible. Inside a holding crucible 23, a depression 24 is formed. The above-mentioned crucible 20 is fitted into this depression 24. Thus, the four parts of the crucible 20 are firmly fixed without being separated.

A production method of plate-like calcium fluoride crystals is explained.

The above-mentioned carbon crucible which has a plurality of plate-like cavities combined in a manner that is reusable was filled with powder which is the raw material for $CaF_2$ and then was inserted in a vertical Bridgman furnace. After that, the inside of the electric furnace was made a vacuum of $1 \times 10^{-6}$ Torr or so, and with the vacuum being kept, the electric furnace was raised to 1450° C. in temperature. With this state, temperature was kept for about two hours, so that the raw material inside was melted in accordance with a temperature distribution to be stable. After that, with the temperature kept, the above described crucible was made to fall at a rate of 15 mm/h. The descent distance on this occasion was 20 cm in total. The temperature gradient at the growth interface was approximately 15° C./cm. Afterwards, the temperature of the electric furnace was lowered to room temperature, in about one day. The crucible was dismantled and crystals were taken out. On the whole, the crystals had been made single crystals. The crystals did not break, and had a shape which matches the shape of a hollow of the crucible.

Regarding the calcium fluoride crystals produced, the dislocation density and the strain amount were measured. For evaluating crystals, the middle part of crystals which had grown among crystals which had just been taken out of the crucible after the cooling of the electric furnace was used.

The dislocation density was measured by measuring the number of etch pits per square centimeter, after a (111) surface was etched. Regarding the strain amount of crystals, crystals were cut off so that they became 3 mm in thickness and the optical strain was measured after optical polishing; therefore, strain was quantified, using optical path difference called the Senarmont method.

Practice Example 7

Crystals of calcium fluoride of a column shape (3 mm in diameter) were produced.

Figure 9A:
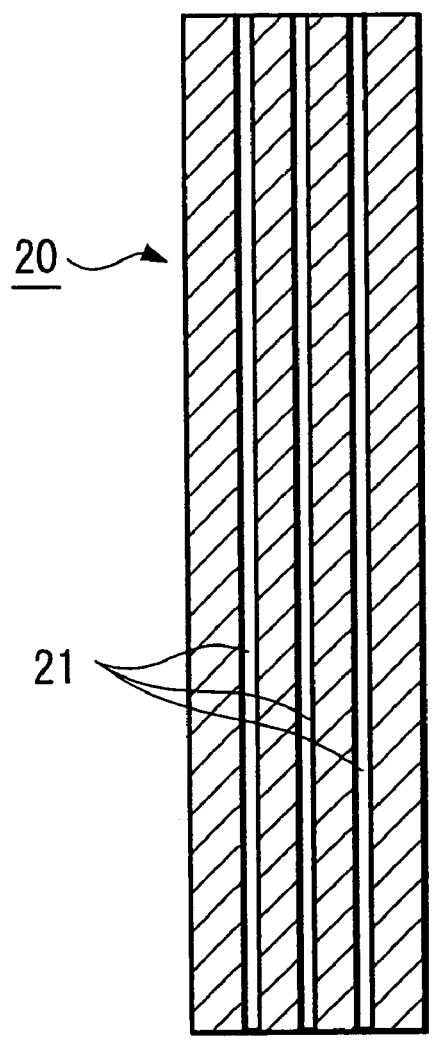
FIG. 9A is a sectional view showing another example of a crucible of the present invention.
Figure 9B:
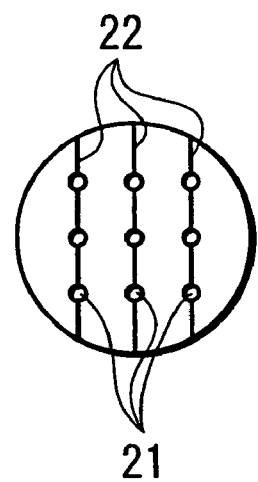
FIG. 9B is a plan view showing another example of a crucible of the present invention.
Figure 9C:
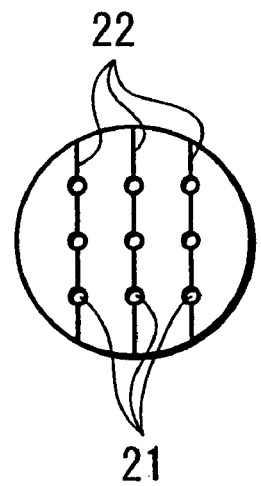
FIG. 9C is a bottom view showing another example of a crucible of the present invention.

FIGS. 9A, 9B and 9C show an example of a carbon crucible when producing the columnar crystals. A crucible 20 consists of four parts, and they are in contact with each other on dividing surfaces 22. Cavities 21 are formed between the parts next to each other. In these cavities 21, columnar crystals are produced. At this time the diameter of a column is 3 mm.

The above-mentioned crucible 20 is fitted into the depression 24 of the holding crucible 23 shown in FIGS. 8A, 8B and 8C.

The production method of the columnar calcium fluoride crystals is similar to the production method of Practice Example 6.

Practice Example 8

Crystals of calcium fluoride of a column shape (1 inch in diameter) were produced.

As a carbon crucible used for producing the columnar calcium fluoride crystals, the one shown in FIGS. 6A, 6B and 6C was used. The diameter of the cavity 21 is 1 inch (2.54 cm).

The production method of the columnar calcium fluoride crystals is similar to the production method of Practice Example 6.

Practice Example 9

Crystals of calcium fluoride of a triangular prism shape were produced. Crystals intended for a prism were produced.

Figure 10A:
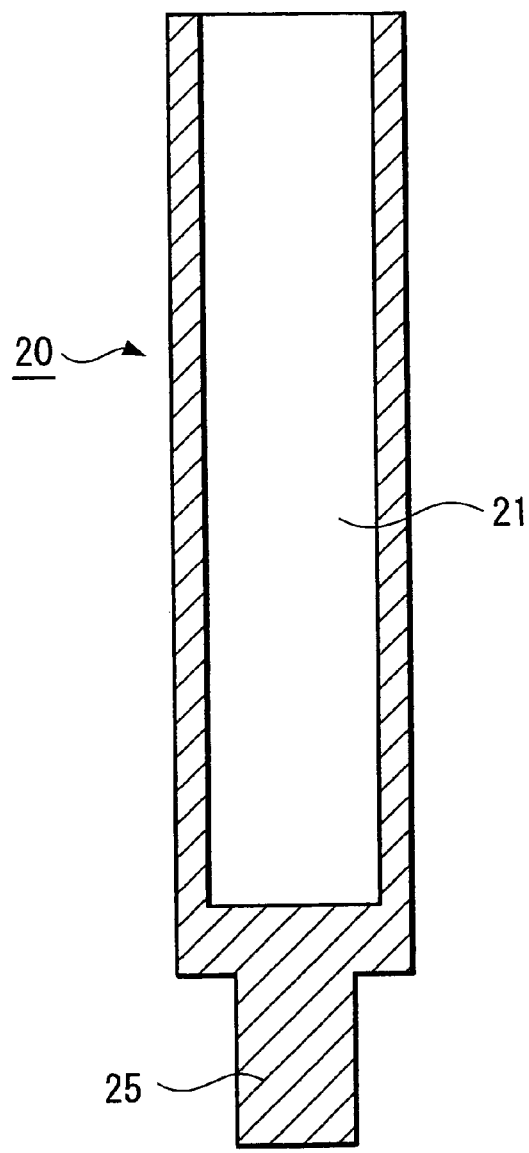
FIG. 10A is a sectional view showing another example of a crucible of the present invention.
Figure 10B:
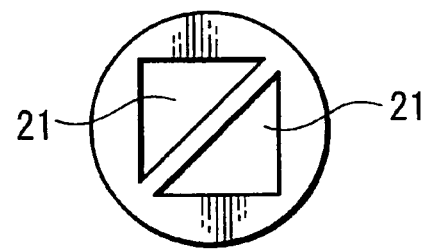
FIG. 10B is a plan view showing another example of a crucible of the present invention.
Figure 10C:
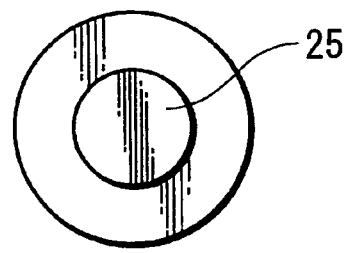
FIG. 10C is a bottom view showing another example of a crucible of the present invention.

FIGS. 10A, 10B and 10C show an example of a carbon crucible when producing the crystals of a triangular prism shape. Cavities 21 are each shaped like a right-angled triangular prism. Regarding each cavity 21, the sides forming the right angle are approximately 10 mm each.

The crystals of calcium fluoride of a triangular prism shape were produced in the same manner as the production method of Practice Example 6 except that after growth the crystals were kept at a temperature of 1100° C. or so for about one hour and then were cooled down to room temperature in about two days. By using this crucible also, single crystals were obtained with ease. After that, by polishing only the surface, a prism was able to be produced with ease.

Comparative Example 2

Crystals of calcium fluoride of a column shape (2 inch in diameter) were produced.

As a carbon crucible used for producing the columnar calcium fluoride crystals, a similar one to that shown in FIG. 6 was used. The diameter of a cavity 21 is 2 inches (5.08 cm).

The production method of the columnar calcium fluoride crystals is similar to the production method of Practice Example 6.

Regarding the calcium fluoride crystals that were produced as described above (Practice Examples 6 to 8 and Comparative Example 2), the dislocation densities and the strain amounts measured are shown in Tables 3 and 4.

The measurement result of the dislocation densities is shown in Table 3. In comparison with the dislocation density of the column (2 inches in diameter) (Comparative Example 2), the dislocation densities of the plate (Practice Example 6), the column (3 mm in diameter) (Practice Example 7) and the column (1 inch in diameter) (Practice Example 8) are small in values. Thus, it has been confirmed that when the shortest diameter of a cross section of crystals is 1 inch (2.54 cm) or less, dislocation density decreases efficiently.

TABLE 3

| Dislocation Density (EPD) | |
| --- | --- |
| Shape and Size | Dislocation Density (piece/cm2) |
| Plate (3 mm in thickness) | $5 \times 10^4$ |
| Column (3 mm in Diameter) | $3 \times 10^5$ |
| Column (1 inch in Diameter) | $1 \times 10^5$ |
| Column (2 inch in Diameter) | $4 \times 10^5$ |

The measurement result of the strain amounts is shown in FIG. 4. In comparison with the strain amount of the column (2 inches in diameter) (Comparative Example 2), the strain amounts of the plate (Practice Example 6), the column (3 mm in diameter) (Practice Example 7) and the column (1 inch in diameter) (Practice Example 8) are small in values. Thus, it has been confirmed that when the smallest diameter of a section of crystals is 1 inch (2.54 cm) or less, strain amount decreases efficiently.

TABLE 4

| Strain Amount | |
| --- | --- |
| Shape and Size | Strain Amount (nm) |
| Plate (3 mm in thickness) | 15.56 |
| Column (3 mm in Diameter) | 28.08 |
| Column (1 inch in Diameter) | 24.96 |
| Column (2 inch in Diameter) | 37.44 |

A crucible used in the present invention is not limited to the crucibles used in Practice Examples 1 to 9. In order to improve the area of a crystal growth interface as much as possible and to enhance gas discharge from the melt, a slanting cavity was produced. In this case as well, crystals grew without problems and high-quality ones were obtained as a result.

The invention claimed is:

1. A light-emitting element device comprising a short-wavelength light-emitting element arranged in a container which has a window with a window board formed of calcium fluoride crystals wherein said calcium fluoride crystals further comprise either a metal or a metal halide, or a combination of both of them, where the metal comprises a titanium, and the metal halide is selected from a group consisting of a titanium fluoride, a magnesium fluoride and a strontium fluoride, and where the calcium fluoride crystals comprise a calcium fluoride where a concentration of the calcium fluoride ranges from 98 mol % to 99.9 mol %.

2. A light-emitting element device according to claim 1, wherein said short-wavelength light-emitting element is a blue light-emitting element.

3. A light-emitting element device according to claim 2, wherein a fluorescent substance is applied to said window board formed of calcium fluoride crystals, and blue light is converted to another visible light.

4. A light-emitting element device according to claim 3, wherein a protective film for preventing reflection and moisture absorption is provided on the front surface and/or back surface of said window board.

5. A light-emitting element device according to claim 2, wherein a protective film for preventing reflection and moisture absorption is provided on the front surface and/or back surface of said window board.

6. A light-emitting element device according to claim 1, wherein one or several kinds among lanthanum based metals of lanthanum, europium, erbium, neodymium, cerium, gadolinium and samarium are added to said calcium fluoride crystals.

7. A light-emitting element device according to claim 6, wherein a protective film for preventing reflection and moisture absorption is provided on the front surface and/or back surface of said window board.

8. A light-emitting element device according to claim 1, wherein yttrium is added to said calcium fluoride crystals.

9. A light-emitting element device according to claim 8, wherein a protective film for preventing reflection and moisture absorption is provided on the front surface and/or back surface of said window board.

10. A light-emitting element device according to claim 1, wherein a protective film for preventing reflection and moisture absorption is provided on the front surface and/or back surface of said window board.

11. A light-emitting element device according to claim 10, wherein said protective film is of $SiO_2$ or $TiO_2$.

12. A light-receiving element device comprising a short-wavelength light-receiving element arranged in a container which has a window formed of calcium fluoride crystals,
wherein said calcium fluoride crystals comprise either a metal or a metal halide, or a combination of both of them,
where the metal is made of a titanium, the metal halide is selected from a group consisting of a titanium fluoride, a magnesium fluoride and a strontium fluoride; and
where the calcium fluoride crystals are made of a calcium fluoride and a concentration of the calcium fluoride ranges from 98 mol % to 99.9 mol %.

13. A light-receiving element device according to claim 12, wherein a protective film for preventing reflection and moisture absorption is provided on the front surface and/or back surface of said window board.

14. A light-receiving element device according to claim 13, wherein said protective film is of $SiO_2$ or $TiO_2$.

15. An optical device comprising a short-wavelength light-emitting element and a light-receiving element which are provided in a container having a window with a window board formed of calcium fluoride crystals,
wherein said calcium fluoride crystals further comprise either a metal or a metal halide, or both of them; and
where the metal is made of a titanium, the metal halide is selected from a group consisting of a titanium fluoride, a magnesium fluoride and a strontium fluoride and the calcium fluoride crystals are made of a calcium fluoride, where a concentration of the calcium fluoride ranges from 98 mol % to 99.9 mol %.

16. An optical device according to claim 15, wherein a protective film for preventing reflection and moisture absorption is provided on the front surface and/or back surface of said window board.

17. An optical device according to claim 16, wherein said protective film is of $SiO_2$ or $TiO_2$.

18. Fluoride crystals containing either metal or metal halide, or both of them,
wherein said metal is made of titanium, said metal halide is made of one or more kinds selected among titanium fluoride, magnesium fluoride and strontium fluoride, and said fluoride crystals are made of calcium fluoride; and
where the concentration of the calcium fluoride ranges from 98 mol % to 99.9 mol %.

* * * * *